(12) United States Patent
Darr et al.

(10) Patent No.: US 11,581,862 B2
(45) Date of Patent: Feb. 14, 2023

(54) PASSIVE SUB-AUDIBLE ROOM PATH LEARNING WITH NOISE MODELING

(71) Applicant: THAT Corporation, Milford, MA (US)

(72) Inventors: Roger R. Darr, Tumwater, WA (US); Matthew Easley, Woodstock, GA (US)

(73) Assignee: THAT Corporation, Milford, MA (US)

( * ) Notice: Subject to any disclaimer, the term of this patent is extended or adjusted under 35 U.S.C. 154(b) by 0 days.

(21) Appl. No.: 17/661,582

(22) Filed: May 2, 2022

(65) Prior Publication Data
US 2022/0352860 A1 Nov. 3, 2022

Related U.S. Application Data

(60) Provisional application No. 63/182,413, filed on Apr. 30, 2021.

(51) Int. Cl.
*H03G 3/24* (2006.01)
*H03G 5/16* (2006.01)
*H03G 3/30* (2006.01)
*H03G 3/32* (2006.01)

(52) U.S. Cl.
CPC .............. *H03G 3/24* (2013.01); *H03G 3/3089* (2013.01); *H03G 5/165* (2013.01); *H03G 3/32* (2013.01)

(58) Field of Classification Search
CPC ........ H03G 3/24; H03G 3/3089; H03G 5/165; H03G 3/32; H03G 5/025
USPC ........................... 381/56, 57, 59, 96, 98, 103
See application file for complete search history.

(56) References Cited

U.S. PATENT DOCUMENTS

| | | | | |
|---|---|---|---|---|
| 8,588,430 | B2 * | 11/2013 | Tirry | ...................... H04M 9/082 381/103 |
| 10,535,363 | B2 * | 1/2020 | Tsujimoto | ........... G10L 21/0232 |
| 10,636,406 | B2 * | 4/2020 | Fink | ......................... H04R 3/04 |
| 2003/0235318 | A1 | 12/2003 | Bharitkar et al. | |
| 2005/0058301 | A1 | 3/2005 | Brown | |
| 2007/0041589 | A1 | 2/2007 | Patel et al. | |

(Continued)

OTHER PUBLICATIONS

PCT International Search Report and Written Opinion dated Aug. 24, 2022 for International Application No. PCT/US2022/027221; 11 pages.

(Continued)

*Primary Examiner* — Xu Mei

(74) *Attorney, Agent, or Firm* — Daly, Crowley, Mofford & Durkee, LLP

(57) ABSTRACT

Frequency domain compensation is provided for spectral impairment resulting from the audio path characteristics for a given audio device in a given listening space. Selected segments of an audio stream are recorded at a listener position to measure degradation in the audio path and to update compensation filter characteristics of the audio device. Recorded transmitted and received audio sequences are aligned based and compared in the frequency domain. The difference between the aligned transmitted and received sequences represents the frequency domain degradation along the acoustic path due to the speaker, the physical attributes of the room, and noise. A dynamically updated noise model is determined for adjusting compensation filter characteristics of the audio device, which can be updated during use of the audio device. A compensation curve is derived which can adapt the equalization of the audio device passively during normal usage.

21 Claims, 9 Drawing Sheets

(56) References Cited

U.S. PATENT DOCUMENTS

| | | | |
|---|---|---|---|
| 2012/0177224 A1* | 7/2012 | Veneri | H04R 3/002 |
| | | | 381/103 |
| 2012/0288124 A1 | 11/2012 | Fejzo et al. | |
| 2015/0023509 A1* | 1/2015 | Devantier | H04R 29/001 |
| | | | 381/58 |
| 2016/0021476 A1 | 1/2016 | Robinson et al. | |
| 2016/0295325 A1* | 10/2016 | Enenkl | H04R 3/04 |

OTHER PUBLICATIONS

Herre et al., "MPEG-H 3D Audio—The New Standard for Coding of Immersive Spatial Audio;" IEEE Journal of Selected Topics in Signal Processing, vol. 9, No. 5 (2015), pp. 770-779 (10 pages); published Aug. 2015.

* cited by examiner

PASSIVE SUB-AUDIBLE ROOM PATH LEARNING WITH NOISE MODELING

CROSS REFERENCE TO RELATED APPLICATIONS

This application claims priority to and benefit of U.S. Provisional Application No. 63/182,413, filed 30 Apr. 2021, entitled "Passive Sub-Audible Room Path Learning Method with Noise Modeling," which is incorporated herein by reference in its entirety.

BACKGROUND

Augmenting the factory tuning of a television (TV) or other audio device to account for auditory effects and conditions of any particular room presents several challenges to the audio system designer. Factory tuning is typically based upon recordings made in the audio near-field in a controlled environment. These recordings are typically of the audio device producing white noise or a swept sine wave and may be used to compensate for speaker frequency response limitations. In-home tuning, however, typically involves recordings made either at the listener position, or by microphones mounted in the television, in rooms with furniture and doorways, non-uniform surfaces and often windows, i.e., a relatively "hostile" audio environment.

Prior art techniques typically require a user to adapt the audio device during initial set-up or to select room compensation via a remote control or push button on the device. These approaches limit compensating for room effects to either occur when the user first sets up the device or when the user happens to remember to update the room compensation. In either case, this results in white noise, a swept sine wave, or other type of annoying audio signal to play loudly for several seconds. Since the entire room compensation solution is determined at once, a momentary noise burst, or other hostile audio event in the listening environment, could cause the room compensation to adapt to the wrong solution. So, with prior art techniques, the user must listen to audio before and after the compensation solution to determine if the adjustment is appropriate. If the acoustic characteristics of the room change, the user has to remember to select the room compensation feature and repeat the loud unpleasant audio sequence. Audio devices, such as wireless speakers, are frequently carried to different rooms or moved within a given room. With prior art techniques the listener must remember and choose to re-adapt room compensation each time the speaker is moved.

SUMMARY

Embodiments of the present disclosure can provide methods, systems, and/or computer-readable media products (software applications) for automatic and "transparent" frequency domain compensation of spectral impairment resulting from the audio path characteristics for a given audio device in a given listening space.

One general aspect includes a system for providing a given audio system with compensation for acoustic degradation due to noise and physical attributes of a given listening environment. The system includes a memory which may include computer-executable instructions; and a processor coupled to the memory and operative to execute the computer-executable instructions, the computer-executable instructions causing the processor to: record, for a given audio device in a given listening environment, a selected segment of a transmitted audio stream, where the segment includes a transmitted training sequence for deriving a frequency response compensation for the audio device in the listening environment; form a frequency domain transform of the transmitted segment; form a frequency domain transform of the recorded selected segment; derive a frequency difference between the transmitted and recorded versions of the selected segment for determining the frequency domain degradation due to the listening environment and background noise; form a dynamically maintained noise model of the background noise; subtract a frequency domain model of the background noise from the frequency domain transform of the recorded signal, thereby forming an adjusted received signal; and apply a frequency domain compensation curve for the audio device based on slow fractional correction function incorporating the adjusted receive signal. Other embodiments of this aspect include corresponding computer systems, apparatus, and computer programs recorded on one or more computer storage devices, each configured to perform the actions of the methods.

Implementations may include one or more of the following features. The selected segments used for the training sequence may include a white noise component. The white noise component may include a maximum length sequence (MLS). The processor can be further configured to update the model of the background noise based on uncorrelated noise remaining after compensation. The processor can be configured to apply the compensation curve in real time. The processor may be further configured to limit adjustment by the compensation curve to a desired attenuation and/or gain. The processor may be further configured to calculate a noise level based on power levels present in the dynamically maintained noise model to compensate for noise events. Implementations of the described techniques may include hardware, a method or process, or computer software on a computer-accessible medium.

One general aspect includes a method for an audio system for a particular room. The method includes recording, for a given audio device in a given listening environment, a selected segment of a transmitted audio stream, where the segment includes a transmitted training sequence for deriving a frequency response compensation for the audio device in the listening environment; forming a frequency domain transform of the transmitted segment; forming a frequency domain transform of the recorded selected segment; deriving a frequency difference between the transmitted and recorded versions of the selected segment for determining the frequency domain degradation due to the listening environment and background noise; forming a dynamically maintained noise model of the background noise; subtracting a frequency domain model of the background noise from the frequency domain transform of the recorded signal, thereby forming an adjusted received signal; and applying a frequency domain compensation curve for the audio device based on slow fractional correction function incorporating the adjusted receive signal. Other embodiments of this aspect include corresponding computer systems, apparatus, and computer programs recorded on one or more computer storage devices, each configured to perform the actions of the methods.

Implementations may include one or more of the following features. The training sequence may include a white noise component. The white noise component may include an MLS. The method may include updating the model of the background noise based on uncorrelated noise remaining after compensation. Applying the compensation curve can be in real time. The method may include limiting adjustment by the compensation curve to a desired attenuation and/or gain. The method may include calculating a noise level based on power levels present in the dynamically maintained noise model to compensate for noise events Implementations of the described techniques may include hardware, a method or process, or computer software on a computer-accessible medium.

One general aspect includes a computer-readable non-transitory storage medium for adapting filters of an audio equalizer (EQ) for a particular room. The computer-readable non-transitory storage medium (e.g., flash drive, hard drive, memory stick, solid-state or flash memory, ROM, RAM, etc.) can include computer-readable instructions for recording, for a given audio device in a given listening environment, a selected segment of a transmitted audio stream, where the segment includes a transmitted training sequence for deriving a frequency response compensation for the audio device in the listening environment; forming a frequency domain transform of the transmitted segment; forming a frequency domain transform of the recorded selected segment; deriving a frequency difference between the transmitted and recorded versions of the selected segment for determining the frequency domain degradation due to the listening environment and background noise; forming a dynamically maintained noise model of the background noise; subtracting a frequency domain model of the background noise from the frequency domain transform of the recorded signal, thereby forming an adjusted received signal; and applying a frequency domain compensation curve for the audio device based on slow fractional correction function incorporating the adjusted receive signal. Other embodiments of this aspect include corresponding computer systems, apparatus, and computer programs recorded on one or more computer storage devices, each configured to perform the actions of the methods.

Implementations may include one or more of the following features. The instructions for the training sequence may include a white noise component. The white noise component may include an MLS. The instructions further may include updating the model of the background noise based on uncorrelated noise remaining after compensation. Applying the compensation curve can be in real time. The instructions further may include limiting adjustment by the compensation curve to a desired attenuation and/or gain. The instructions further may include calculating a noise level based on power levels present in the dynamically maintained noise model to compensate for noise events. Implementations of the described techniques may include hardware, a method or process, or computer software on a computer-accessible medium.

A system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions.

The features and advantages described herein are not all-inclusive; many additional features and advantages will be apparent to one of ordinary skill in the art in view of the drawings, specification, and claims. Moreover, it should be noted that the language used in the specification has been selected principally for readability and instructional purposes, and not to limit in any way the scope of the present disclosure, which is susceptible of many embodiments. What follows is illustrative, but not exhaustive, of the scope of the present disclosure.

BRIEF DESCRIPTION OF THE DRAWINGS

The manner and process of making and using the disclosed embodiments may be appreciated by reference to the figures of the accompanying drawings. It should be appreciated that the components and structures illustrated in the figures are not necessarily to scale, emphasis instead being placed upon illustrating the principals of the concepts described herein. Furthermore, embodiments are illustrated by way of example and not limitation in the figures, in which.

DETAILED DESCRIPTION

Figure 1:
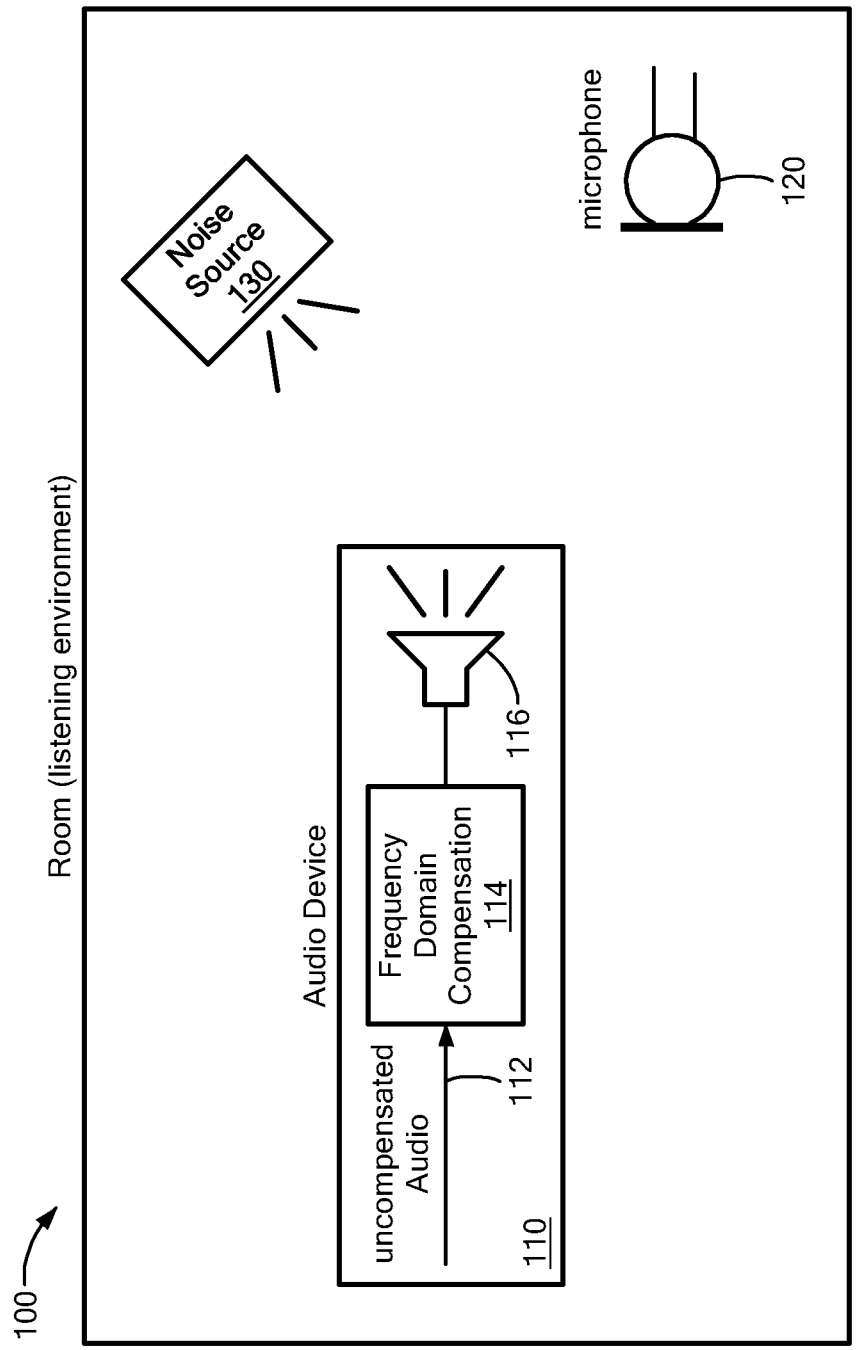
FIG. 1 is a diagram showing a room listening environment, receiving equipment, transmitting equipment, and a noise source, in accordance with an exemplary embodiment of the present disclosure.

The features and advantages described herein are not all-inclusive; many additional features and advantages will be apparent to one of ordinary skill in the art in view of the drawings, specification, and claims. Moreover, it should be noted that the language used in the specification has been selected principally for readability and instructional purposes, and not to limit in any way the scope of the inventive subject matter. The subject technology is susceptible of many embodiments. What follows is illustrative, but not exhaustive, of the scope of the subject technology.

Embodiments of the present disclosure can provide methods, systems, and/or computer-readable media products (software applications) for frequency domain compensation of spectral impairment or degradation resulting from the audio path characteristics for a given audio device or system in a given listening space. Embodiments include a noise modeling feature, e.g., a dynamically maintained and updated noise model of the listening space. One or more selected segments of an audio stream are used as training sequences and recorded at a listener location in the listening environment. The recorded segments are used for measuring degradation in the audio path and to update compensation filter characteristics of the audio device. In exemplary embodiments, a white noise component, e.g., a sub-audible maximum length sequence (MLS) or other pseudorandom binary sequence, can be included in one or more selected audio stream segments presented to the speaker system of the audio device. Each selected segment can be used as a synchronization signal to allow time alignment of the audio signal presented to the speaker system with an audio signal recorded at a listener position. The received (recorded) and transmitted audio sequences are compared in the frequency domain. The difference between the aligned transmitted and received sequences represents the frequency domain degradation along the acoustic path(s) due to the speaker, the physical attributes of the room, and noise.

A noise model can be determined and, e.g., subtracted from the frequency domain version (transform) of the received segment(s) (or, sequences). The resulting adjusted signal removes the noise component and can be used for adjusting compensation filter characteristics (e.g., gain settings for frequency bands) of the audio device, which can be updated during use of the audio device. The noise model can be dynamically maintained and updated. Embodiments of the present disclosure accordingly can allow the audio device to adapt the equalization (frequency compensation) of the transmit audio passively or automatically, without user intervention, during normal usage. Thus, embodiments of the present disclosure can remove any need for pausing audio playback to source white noise or a swept sine wave as a calibration step. This can allow the audio device to adapt to new speaker positions, furniture changes, different wall treatments, etc.

FIG. 1 shows an example of a listening environment 100—e.g., a given room, enclosed space, or partially enclosed space—with audio transmitting equipment, e.g., an audio device 110, e.g., a standalone TV, a sound bar, a stereo system, etc., in accordance with the present disclosure. The listening environment 100 also includes receiving equipment 120 e.g., a microphone, and noise, represented by an indicated noise source 130, e.g., an air conditioner, refrigerator, fan, dishwasher, etc. The audio device 110 has frequency domain compensation functionality, e.g., indicated by compensation processor 114 (which can also be referred to as filter 114), which can operate to apply a dynamically calculated compensation curve or set of filter coefficients to the uncompensated audio signal stream 112 before it is applied to the speaker(s) 116.

The recording device 120 records segments of the audio output from the audio device 110. Audio device 110 can include means or functionality to signal the recording device 120 to begin the recording process. Recording device 120 can also include means or functionality to transmit the recording(s) to the audio device 110. For example, the audio device 110 and recording device 120 may include wireless functionality, e.g., Wi-Fi, Bluetooth, and/or cloud-based functionality, e.g., servers, for communication purposes. Frequency response compensation may be implemented by a suitable processor, e.g., a central processing unit (CPU), digital signal processor (DSP), microcomputer, etc., connected to or included in audio device 110, e.g., as described in further detail below.

STEP 1: Recording a Selected Segment of Audio Content From the Audio Device.

Embodiments of the present disclosure provide or utilize a periodic training or learning procedure, to automatically and transparently adapt an audio device or system to a given listening environment (e.g., room). As one step the receiving equipment 120 (e.g., remote control microphone, integrated microphone, smartphone, standalone mic) is signaled or activated to begin recording audio samples of the output of the audio device 110. This is typically done at a listening position in the given room (listening environment). The recorded audio samples include selected or chosen audio segments (see FIG. 2). The selected segments are used for determining audio path degradation, as described in further detail below.

Figure 8:
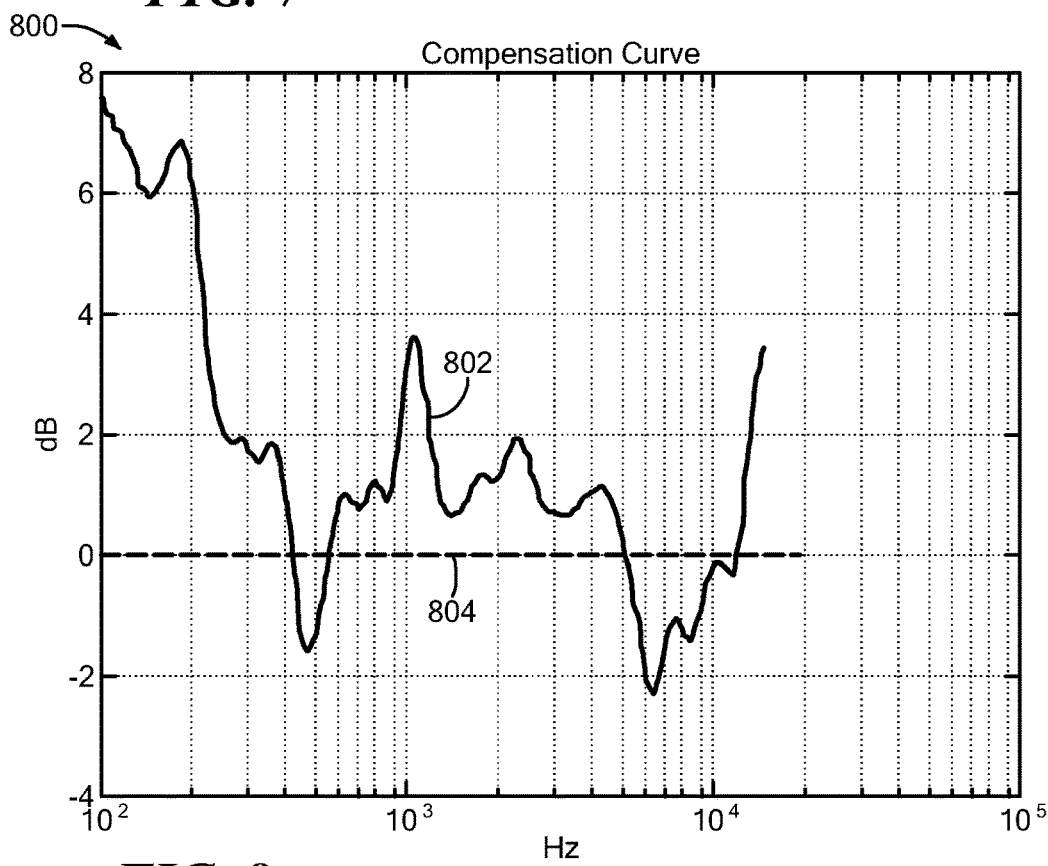
FIG. 8 shows a compensation curve calculated after a number of iterations, in accordance with the present disclosure.

As noted, a compensation filter 114 operative to provide frequency compensation is included in the transmitting equipment, e.g., audio device 110, and can be initialized to be flat with a gain of 0 dB over the applicable audio bandwidth (see, e.g., initial setting 804 in FIG. 8). The compensation filter 114 is used to apply compensation to the audio stream prior to transmission such that the transmitted audio stream has had compensation applied (unless the filter functionality has been rendered inactive for whatever reason). The compensation curve or filter 114 (or processor implementing the curve or filter) can subsequently be adjusted based on processing of the recorded samples from the receiving equipment 120, e.g., based on a noise model, as described in further detail below.

Figure 2:
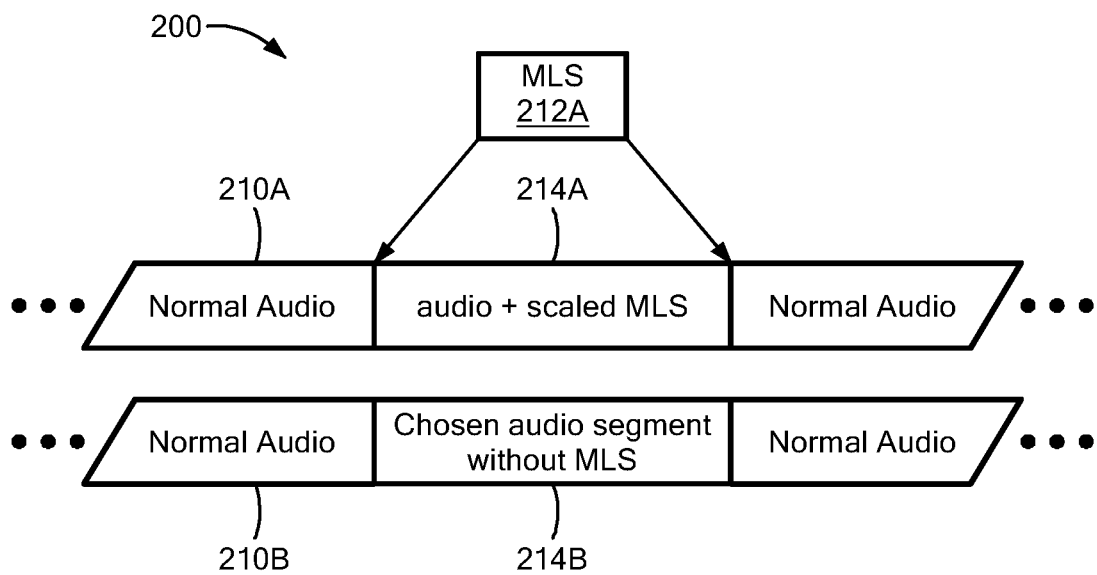
FIG. 2 is a diagram showing a pair of audio streams with chosen or selected segments, one with a scaled maximum length sequence (MLS) summed into a portion of the normal outgoing audio stream and the other segment without a MLS, in accordance with exemplary embodiments of the present disclosure.

FIG. 2 is a diagram 200 showing a pair of audio streams 210A, 210B, with chosen or selected segments 214A-B, with a scaled MLS 212A summed into a portion of the normal outgoing audio stream, i.e., segment 214A, and the other 214B segment shown without an MLS, in accordance with exemplary embodiments of the present disclosure. As indicated, an MLS or other white noise approximating sequence can be (optionally) included with or added to a selected segment of the outgoing audio stream, e.g., as provided to audio device speaker(s). In exemplary embodiments, an MLS can be sub-audible, where "sub-audible" refers to being of a pitch and/or a loudness that a typical person cannot hear when combined with typical audio. By being sub-audible, the MLS is effectively undiscernible by, and thus transparent to, a typical user.

The selected segments 214A-B are used to measure or model the degradation on the acoustic path (superposition of paths) from the audio device speaker(s), e.g., speaker 116 of FIG. 1, to the listener position in the listening environment. The degradation can include components due to speaker loss, absorption and reflection by surfaces in the listening environment, and ambient noise in the listening environment. For the degradation measurement, the segments are cross-correlated to align the segments in time and calculate lag, as explained in further detail below. Including a white noise component in a selected segment, e.g., segment 214A, can facilitate or enhance the correlation. If an MLS (or other white noise component) is used, the transmitting equipment (TV, soundbar, wireless speaker, etc.) may begin mixing the MLS with the program audio at a level deemed below human perception, or it may simply transmit the audio unmodified. The MLS or other white noise component is optional and in the absence of such a sequence, the original audio content can be used for synchronization; whichever segment is selected, the audio is preferably not self-similar (repeating), e.g., has a low degree of autocorrelation, over the duration of the recorded audio segment chosen for synchronization.

Figure 3:
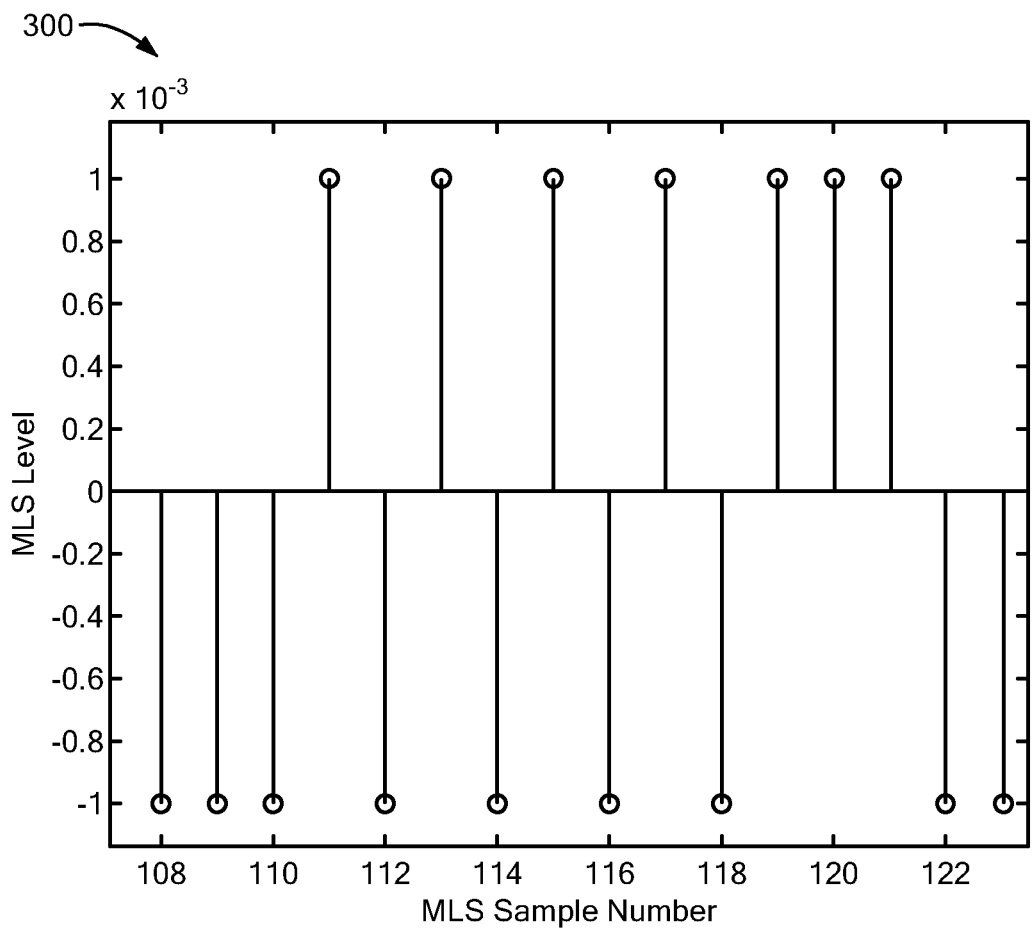
FIG. 3 is a plot showing scaled samples of a maximum length sequence, in accordance with exemplary embodiments of the present disclosure.

FIG. 3 is a plot 300 showing scaled samples of a maximum length sequence (MLS), in accordance with exemplary embodiments of the present disclosure. Time segments of digital audio program content can be selected prior to or during presentation of audio content (signals) to the speaker system, e.g., speaker(s) 116 of FIG. 1. As noted previously, a selected audio stream segment can be (optionally) mixed with a white noise component such as a pseudo-random binary maximum length sequence (MLS). The time segments can be chosen or selected at periodic intervals of the audio program (stream of audio). The sequence can be sampled and scaled. For example, certain samples are shown, i.e., the $108^{th}$ through $123^{rd}$ samples, of a maximum length sequence (MLS) are shown scaled by a suitable scaling constant, 0.001 for the case shown. In the figure, a value of 0.001 represents a logic high (1) and a value of −0.001 represents a logic low (0). Other scaling factors may of course be used within the scope of the present disclosure.

Figure 4:
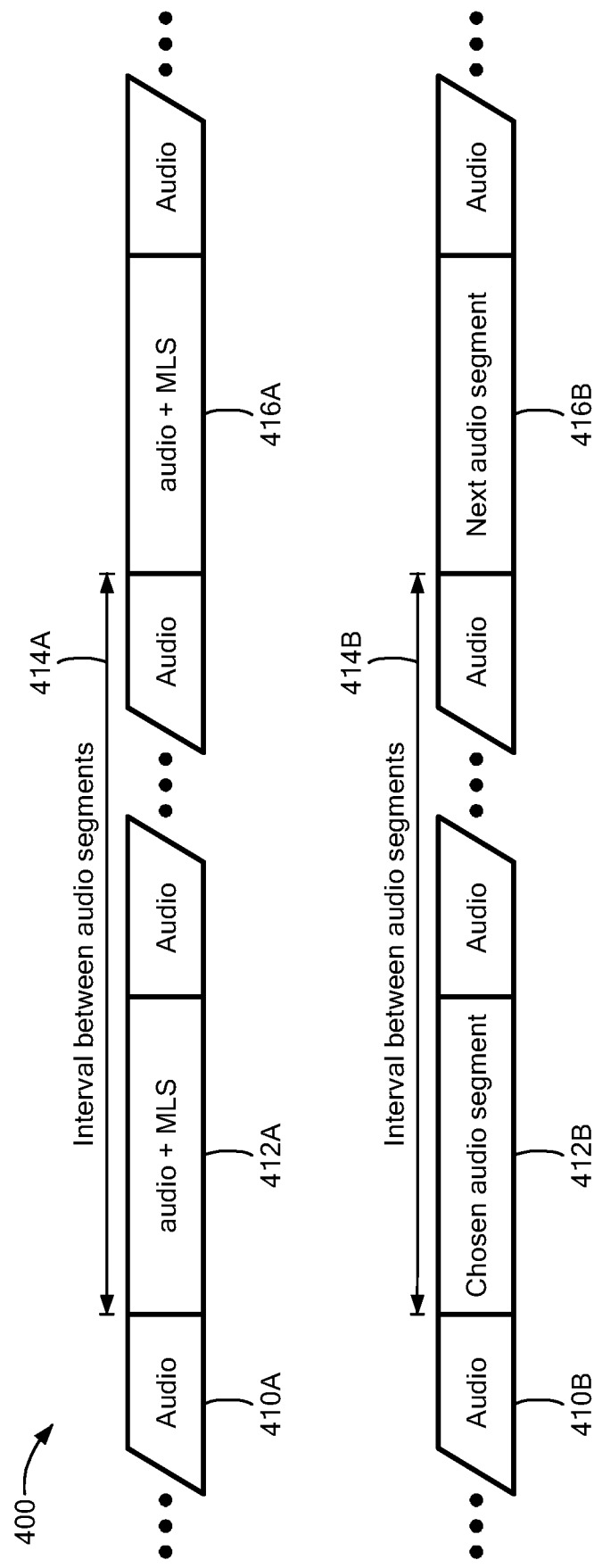
FIG. 4 shows a time interval between chosen segments in an audio stream, in accordance with exemplary embodiments of the present disclosure.

FIG. 4 is a diagram 400 showing a time interval between chosen/selected segments in an audio stream, in accordance with exemplary embodiments of the present disclosure. Two audio streams 410A, 410B are shown. Audio stream 410A includes multiple selected segments 412A and 416A that include an MLS and that are separated by an interval 414A, which can be selected as desired. Audio stream 410B includes selected segments 412B and 416B (without MLS) that are separated by interval 414B. The intervals 414A-B between segments can be chosen with to be constant, or the time intervals can vary.

STEP 2: Determining Audio Path Degradation.

The received and transmitted audio sequences, as recorded, are aligned based on maximum cross-correlation, normalized for overall mid-range volume level, and compared after conversion into the frequency domain, e.g., after being processed by a DFT/FFT. This process can be performed by one or more processors, e.g., in or connected to the audio device 120. The difference between the aligned transmitted and received sequences is determined and represents the frequency domain degradation on the audio path (from the speaker to the receiving equipment) due to the speaker, room physical attributes, and ambient noise. If the audio device speaker response is known, it can be taken into account when determining the difference, such that the difference will then only represent room degradation at the recording position plus degradation due to noise.

STEP 3: Noise Model Derivation.

A frequency domain model of the background noise environment is derived and subtracted from the frequency domain representation (e.g., FFT) of the recorded signal. After subtraction (e.g., as described above), the noise model is updated based on the remaining uncorrelated noise. In exemplary embodiments, the noise model is updated in a similar manner to the primary compensation filter but based on an additive rather than multiplicative relationship with a fast-decay slow attack filter and a mathematical weighting which speeds adjustment in frequency bands where the transmitted program content is known to be less energetic.

Figure 5:
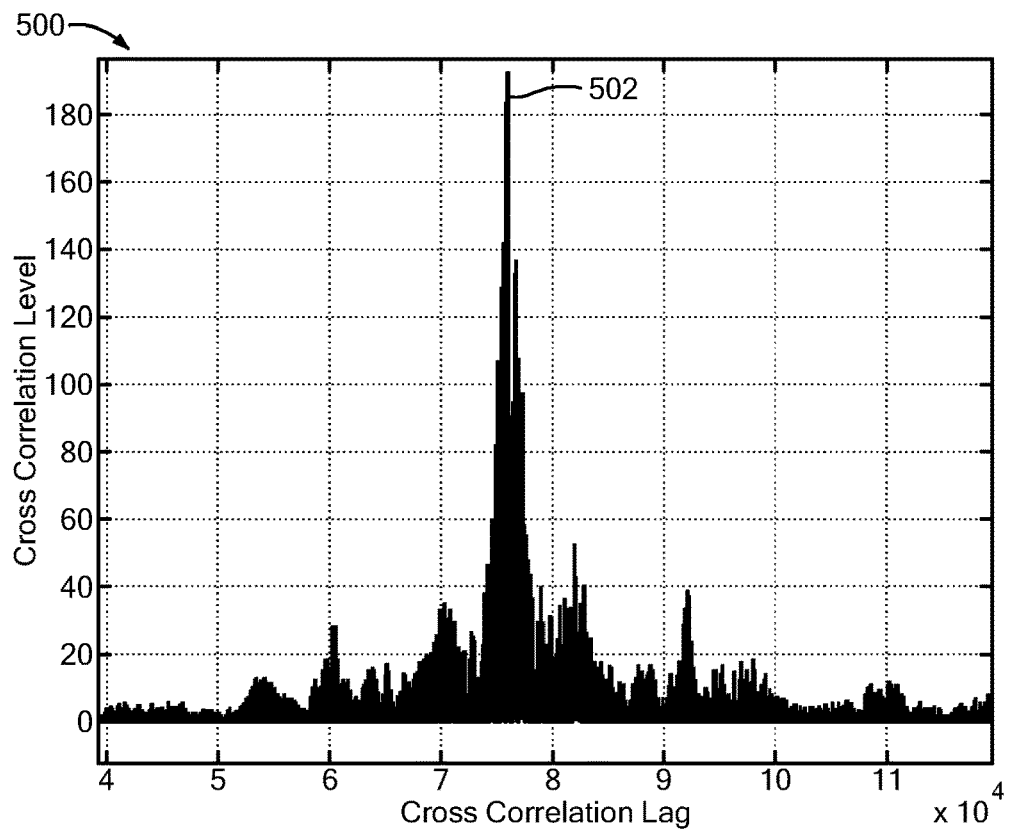
FIG. 5 shows a graph of cross-correlation of a transmitted sequence with a recorded sequence, in accordance with exemplary embodiments of the present disclosure.

FIG. 5 shows a graph 500 of cross-correlation of a transmitted sequence (audio segment) with a recorded sequence (audio segment), in accordance with exemplary embodiments of the present disclosure. The lag axis is shown with units of samples $\times 10^4$. A digital recording system captures a longer time sequence containing the selected transmitted program content (including any MLS, if used) from the listening space. The transmitted segment (e.g., either of segment 214A or segment 214B in FIG. 2) is cross-correlated with the corresponding recorded (and digitized) segment to locate the same-length subset in the received sequence which maximally correlates with the transmitted sequence. The cross-correlation peak and lag are used to align (in time) the recorded audio samples with transmitted audio samples, to adjust for time delay due to propagation of the audio signals along the audio path(s) from the speaker(s) to the receiving equipment. Peak 502 is mainly the result of correlation of the transmitted audio with recorded audio, but for the example shown, it is enhanced by the presence of the optional scaled MLS signal.

The two selected segments (the transmitted segment and the corresponding same length recorded segment) can be normalized for overall gain in a mid-range (e.g., about 300 Hz to about 5 kHz). Next, the frequency spectra of the two sequences are compared, e.g., via the magnitude of Discrete Fourier Transform (DFT/FFT) results. Gain normalization can be done in the frequency domain, in alternate embodiments. A compensation array (of filter coefficients) can be adjusted over the course of processing multiple recorded segments such that it integrates or converges over time (or iterations) to a frequency domain array which reciprocates, or compensates for, the frequency domain impairment of the room path, subject to any desired smoothing or gain constraints. The compensation array can be implemented by a suitable filter or filter topology, e.g., an FIR filter, multiple IIR filters, or by direct frequency domain compensation. There are many known techniques for synthesizing the filter including, but not limited to, taking the inverse FFT of the frequency domain compensation array (FIR) or using a genetic-based adaptation algorithm that utilizes the compensation array as the frequency response target (IIR).

As described in further detail below, a noise model can be derived and maintained to identify the frequency and magnitude of continuous interfering (ambient) noise in the listening space (e.g., room 100 in FIG. 1) which is not well correlated with the transmitted audio program content over time. The noise model can be used to refine the (error) feedback when calculating adjustments to the room path compensation. A mathematical weighting can be used such that when the program content is relatively quiet in a given frequency, the noise model receives a stronger adjustment weight, and conversely when the program content has high energy in a given frequency, the room path compensation filter receives the majority of the adjustment weight because any effects from ambient noise are masked by the louder program content. The frequency response of the microphone can be taken into consideration if needed. This can be done either by focusing on a sub-band within the microphone frequency response or frequency compensating for the overall microphone response.

Figure 6:
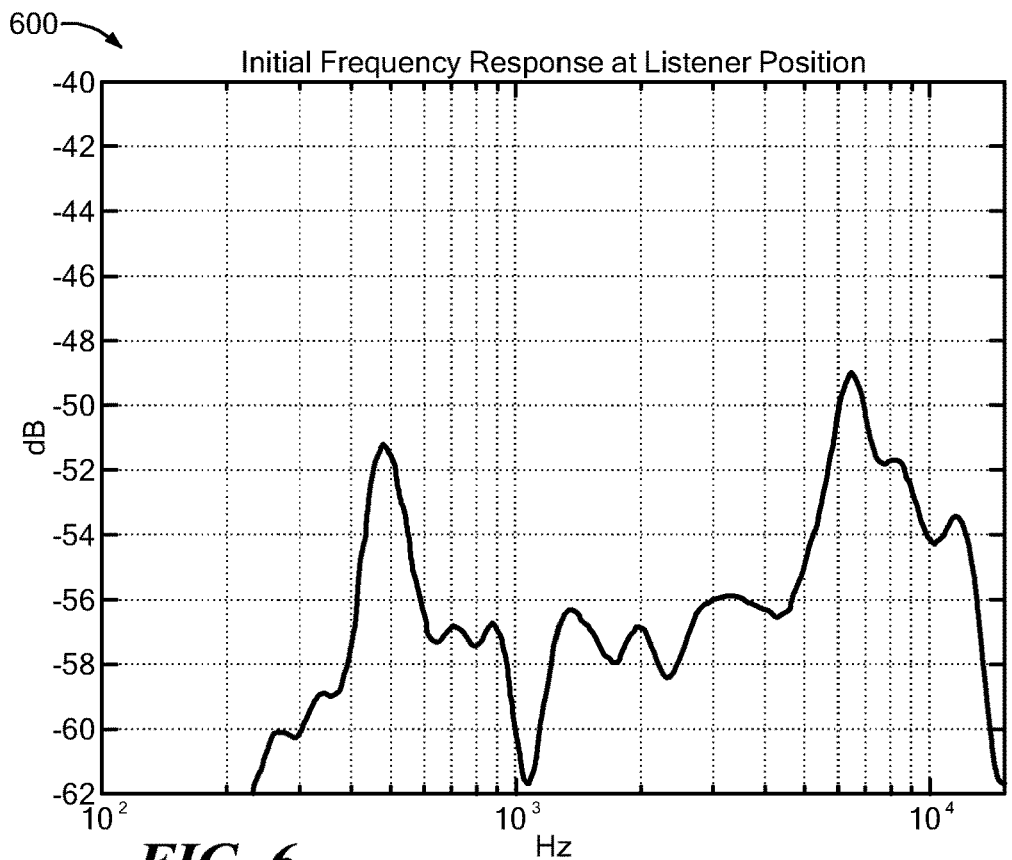
FIG. 6 is a plot showing an example of a frequency response before room path learning, in accordance with an exemplary embodiment of the present disclosure.

FIG. 6 is a plot 600 showing an example of a frequency response at a listener position for an example speaker and room configuration, prior to room path learning. Plot 600 is based on results of recording in particular room (listening environment). The vertical axis range is provided for relative level reference as a function of frequency.

Figure 7:
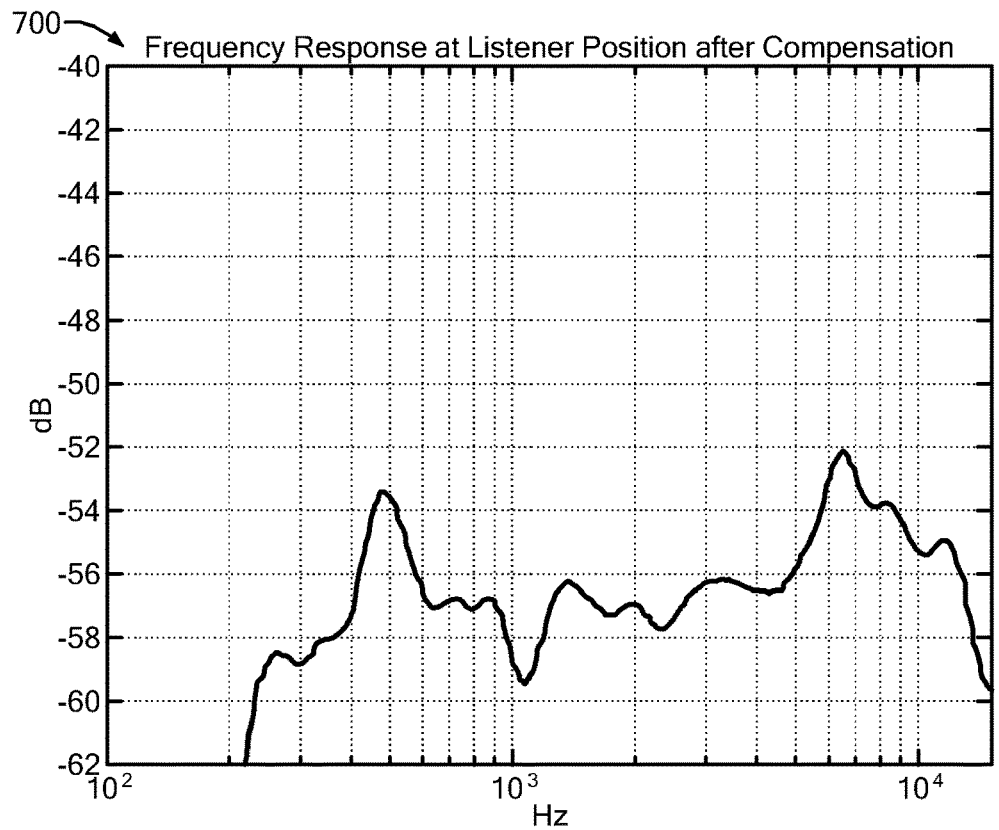
FIG. 7 is a plot showing a compensated frequency response at the listener position used for FIG. 6, after analysis of a number of audio segments with an integrated MLS segment, in accordance with an exemplary embodiment of the present disclosure.

FIG. 7 is a plot 700 showing a compensated frequency response at the listener position used for FIG. 6, after analysis of a number of audio segments (25) with an integrated MLS segment, in accordance with an exemplary embodiment of the present disclosure. Note that the audio peaks and troughs have been significantly compensated. Analysis of further audio segments would provide increasingly better results. The vertical axis range is provided for relative level reference as a function of frequency.

FIG. 8 is a plot 800 showing an example of a frequency compensation curve 802 calculated after a number of iterations (25), in accordance with the present disclosure. Frequency compensation curve 802 indicates the frequency response compensation applied to the audio device used in the room where the recordings were made for the results shown in FIGS. 6-7, where FIG. 6 indicates the recordings before audio compensation and FIG. 7 indicates the frequency response at the same listener position after audio compensation in accordance with the present disclosure.

For curve 802, twenty-five (25) iterations were utilized, based on a like number of successive segments recorded from the program stream of the related audio device. The recorded segments each included an MLS. An initial setting 804 is shown for the compensation curve, indicating 0 dB (no gain or attenuation) for the frequencies across the working range of the related audio device. Of course, while twenty-five iterations were used, other numbers of iterations may be used within the scope of the present disclosure. The compensation curve 802 was derived using algorithms 900 and 1000 described below for FIGS. 9-10.

The optional MLS, if included, is preferably sub-audible. In other words, it is preferably at such a low level of loudness that it is not audible to the listener. Ramping of the onset and turn-off, or AGC methods may be used to decrease the audibility of the MLS at a given audio transmit power level. In most cases an MLS is not needed for the method to function well, but if included it may help ensure accurate identification of the received time segment particularly in the cases where the content is at a low level or highly self-similar (has a high degree of self-repeating features).

Figure 9:
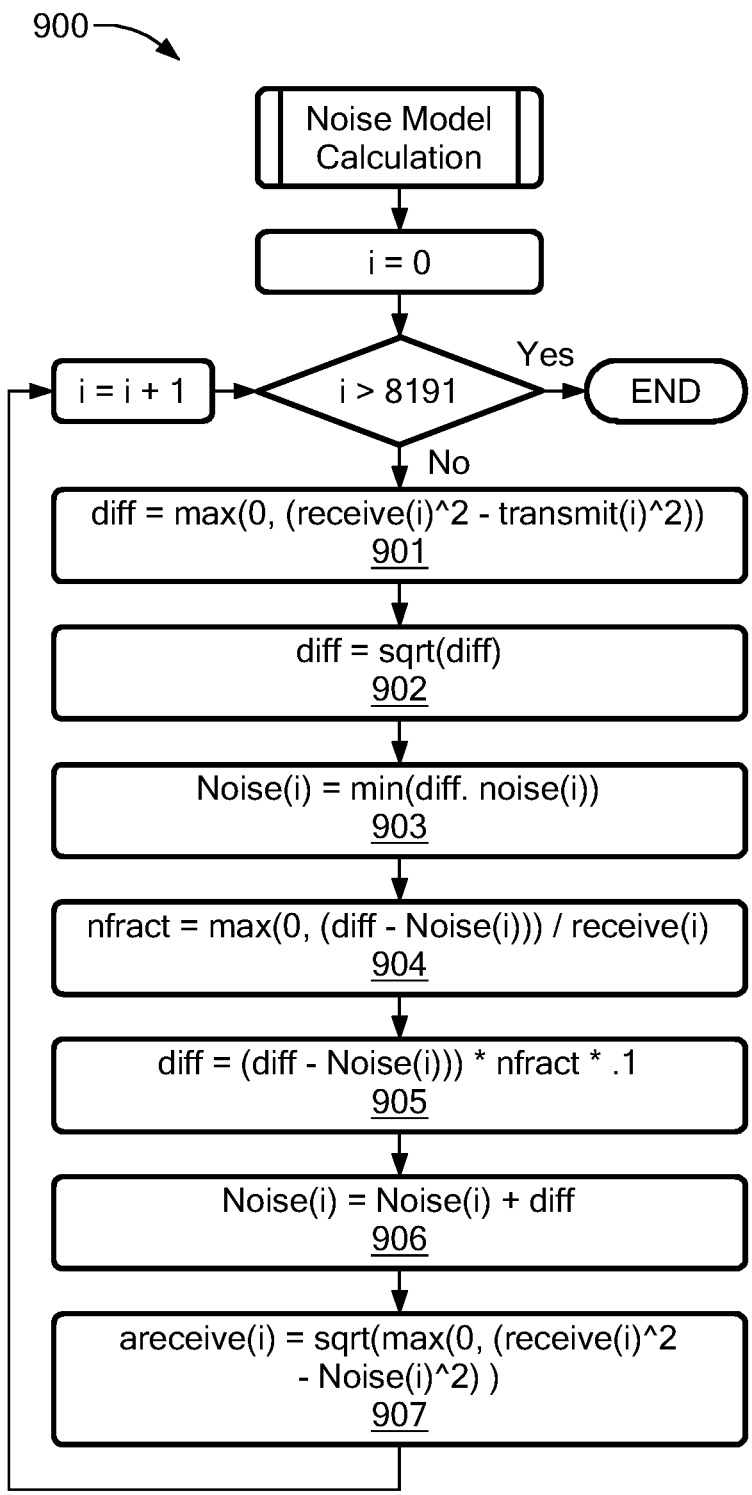
FIG. 9 is a flowchart for an example of a noise model calculation, in accordance with an exemplary embodiment of the present disclosure.

FIG. 9 depicts a flowchart 900 for an example of a noise model calculation (derivation, maintenance, or construction) algorithm, in accordance with embodiments of the present disclosure. The example shown in the diagram assumes that an 8192-point FFT has been calculated for the aligned transmitted and received segments, indicated by vector (1D) arrays "transmit(i)" and "receive(i)," respectively, where $0 \le i \le 8191$ (as shown). Each frequency bin (represented by the index, i) is analyzed. Algorithm 900 produces a frequency domain noise model (vector array "Noise(i)") that is continuously updated and also an adjusted frequency domain version of the received signal (vector array "areceive(i)") that has noise removed.

Processing block 901 calculates the difference (diff) between the received power and transmitted power. The difference is preferably prevented from going below 0, as indicated. Processing block 902 returns the difference to magnitude. Processing block 903 implements the fast decay as the noise is never allowed to exceed the calculated difference. Processing block 904 can determine what fraction (indicated as "nfract") of the difference will be used to update the noise model. This fraction is inversely proportional to the magnitude of the received signal in that particular frequency bin. If there is significant signal energy in the bin, the fraction will be extremely small and the noise model will not exhibit significant adjustment in that bin. The noise model is only adjusted in those bins where there is little or no audio. Over the course of multiple transmitted/received sequences the noise model will adjust at all frequencies.

Processing block 905 adjusts the difference by the fraction and introduces the slow attack factor (e.g., 0.1 as shown; however, other values may be used). Processing block 906 updates the noise model at frequency bin i. When the audio device, e.g., 110 of FIG. 1, is first moved to a new location, the frequency domain noise model can be reset to all zeros (e.g., as shown by initial setting 804 in FIG. 8). Processing block 907 creates an adjusted received signal (vector array "areceive(i)") by removing the noise from the received signal. One skilled in the art can see that over multiple iterations of processing aligned transmitted and received (successive) audio stream segments or sequences, a model of the room noise will accordingly be created and updated.

STEP 4: Compensation Based on Slow Fractional Correction.

In example embodiments, a slow fractional correction function is applied to the frequency domain compensation curve. In other words, effectively a working frequency domain equalizer level set is maintained and each band is adjusted very slightly or modified based on whether the received spectrum was found to be above or below the transmitted spectrum in that band. The details of the correction may be different for real-time or near real-time ("online") embodiments relative to non-real-time ("offline") embodiments. If the integrated frequency domain correction function is to be formed offline and previewed by the user before being applied, then the working correction function is preferably applied to the received audio mathematically or subtracted from the difference comparison in the frequency domain as part of the feedback. However, if the updated compensation is applied in real time, then that step can be omitted. See FIG. 10, described in detail below.

Figure 10:
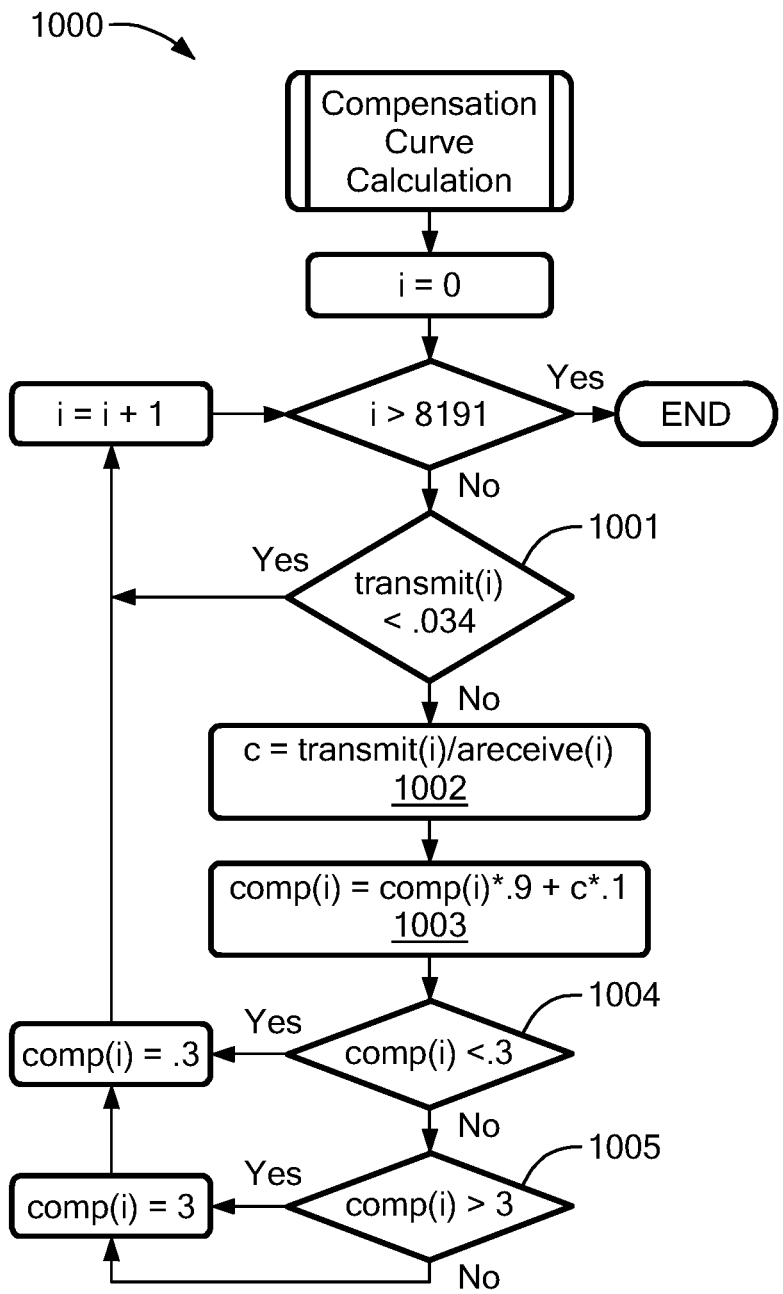
FIG. 10 shows a flowchart for an example of a slow fractional correction function to develop a frequency domain compensation curve, in accordance with an exemplary embodiment of the present disclosure.

FIG. 10 shows the flowchart for one example of a slow fractional correction algorithm 1000 used to develop a frequency domain compensation curve. This algorithm (process) 1000 is executed each time a new time sequence has been recorded. This example assumes that an 8192-point FFT was used to calculate the aligned transmitted audio (transmit) and received (receive) audio frequency responses. At the end of the algorithm 1000, an updated frequency domain compensation curve (vector array "comp(i)") is calculated.

At processing block 1001, the transmit frequency component is compared to a low threshold value, e.g., 0.034, as shown (other values may be used). The value 0.034, in this example, is based upon a peak audio level of 1.0 after normalization. Each frequency bin is analyzed individually. Processing block 1001 shows that if there is little or no audio energy in a given frequency bin, that frequency of the compensation curve is not updated. This prevents an erroneous adjustment. Over time, as the frequency content of the audio changes, there will be an opportunity to update all frequency bins.

Processing block 1002 shows that if there is sufficient audio energy, the ratio (transmit(i)/areceive(i)) of transmit to receive is calculated for the current frequency bin. As noted above, the adjusted received signal ("areceive(i)") is generated by the noise model calculation function (e.g., as described above for FIG. 9). Processing block 1003 adjusts the compensation curve for the current frequency bin. In process 1000, the compensation curve maintains 90% of its current values and is adjusted by 10% of the calculated ratio.

Other values for the percentages of the current value and calculated ratio may be used. This allows a slow, stable adjustment that will not be affected by an occasional system error.

Finally, processing blocks 1004 and 1005 can limit the adjustment to a desired attenuation and/or gain, e.g., an attenuation of 0.3 (−10.46 dB) and a gain of 3 (9.5 dB), as shown, to avoid extreme adjustments. Other attenuation and/or gain limits may of course be used within the scope of the present disclosure. One can see that over time the compensation curve will adapt to the room characteristics. When the room characteristics change or the audio device is moved to a different listening environment (e.g., room), the compensation curve will re-adapt to compensate for the changes in listening environment.

STEP 5: Noise Level Output Calculation (Optional).

A noise level output may optionally be calculated based on power levels present in the dynamically maintained noise model from STEP 3. This noise level output can be used to make changes to the integrated audio processing (TV audio post processing for example) to compensate for noise events. One example would be the TV increases the volume level when a noisy air conditioner turns on and returns to a normal level when it turns off.

Figure 11:
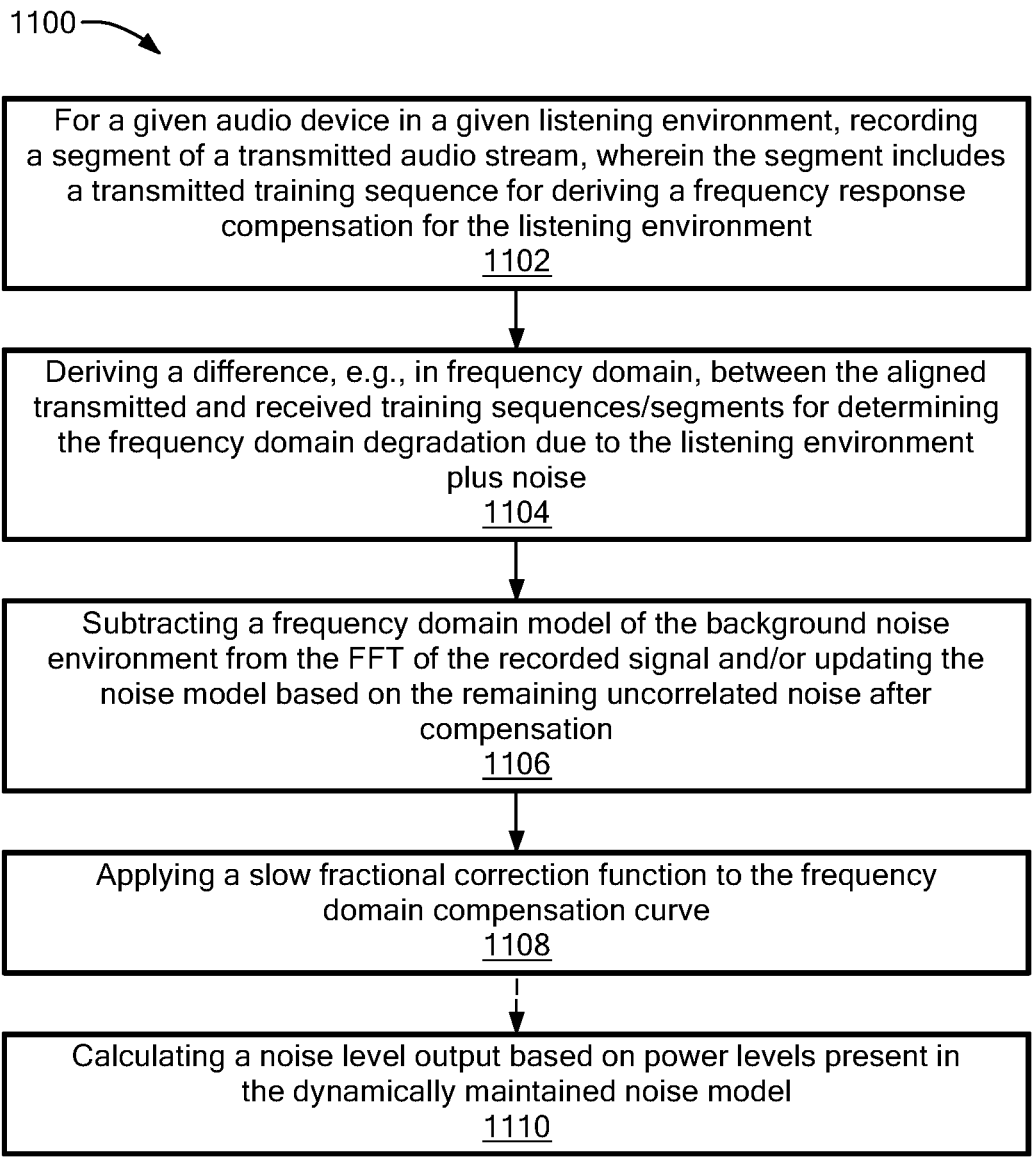
FIG. 11 is a block diagram of an example method of providing a given audio device or system with compensation for speaker limitations and acoustic degradation due to noise and physical attributes of a given listening environment, in accordance with exemplary embodiments of the present disclosure.

FIG. 11 is a block diagram of an example method 1100 of providing a given audio system or device with compensation for acoustic degradation due to noise and physical attributes of a given listening environment, in accordance with the present disclosure. Method 1100 can include, for a given audio device in a given listening (auditory) environment, recording a segment of a transmitted audio stream, wherein the segment includes a transmitted training sequence for deriving a frequency response compensation for the listening environment, as described at 1102. Method 1100 can include deriving a difference between the aligned transmitted and received training sequences for determining the frequency domain degradation by the speaker and listening environment plus noise, as described at 1104.

Method 1100 can include subtracting a frequency domain model of the background noise environment from the FFT of the recorded signal, as described at 1106; step 1106 (or similar step) can also include updating the noise model based on the remaining uncorrelated noise after subtraction. Method 1100 can include applying a slow fractional correction function to the frequency domain compensation curve used for the audio device, as described at 1108. Method 1100 can (optionally) also include calculating a noise level output based on power levels present in the dynamically maintained noise model, as described at 1110.

Figure 12:
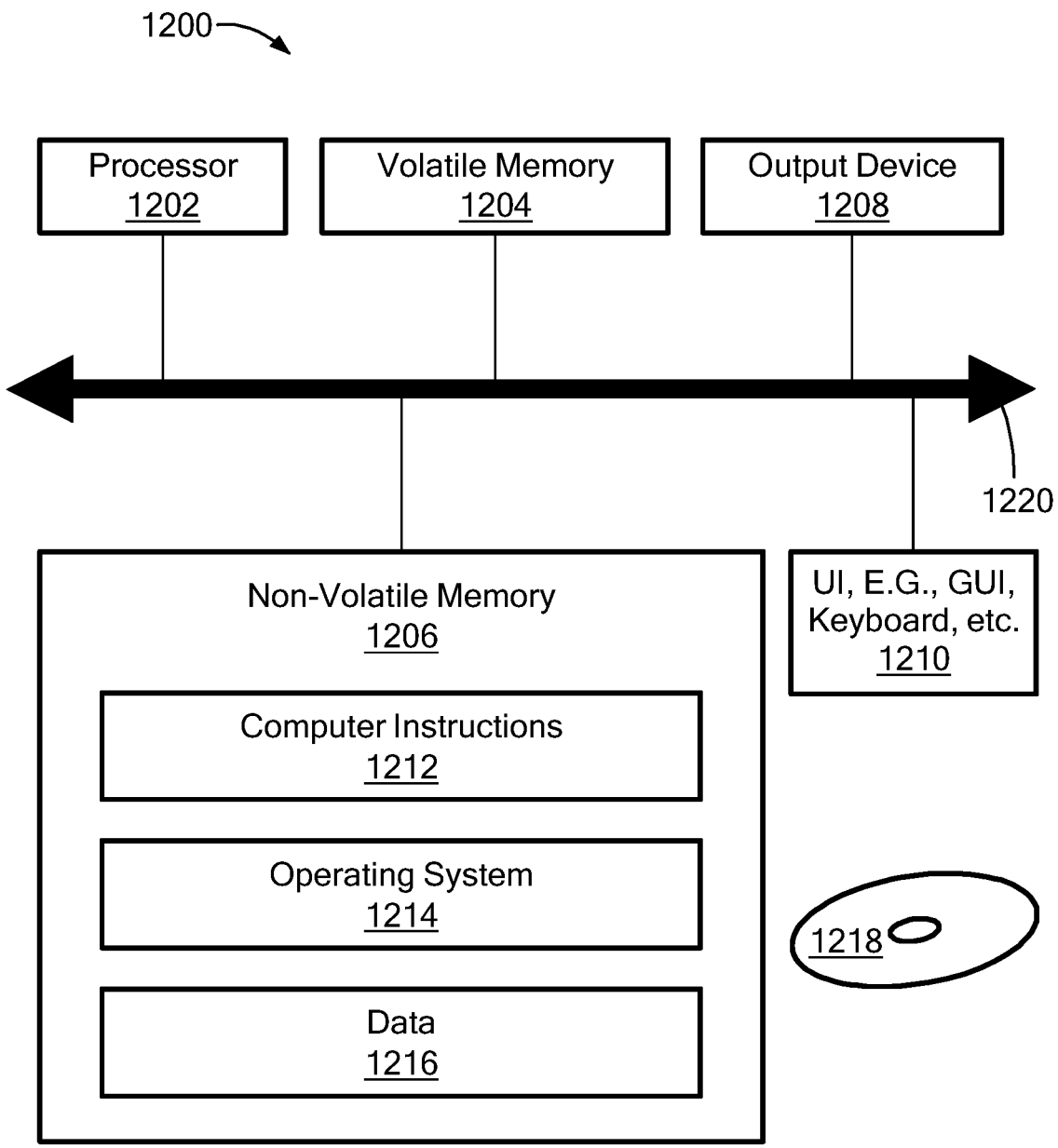
FIG. 12 is a block diagram of an example computer system operative to perform processing, in accordance with the present disclosure.

FIG. 12 is a block diagram of an example computer system 1200 operative to perform processing, in accordance with the present disclosure. Computer system 1200 can perform all or at least a portion of the processing, e.g., steps in the algorithms and methods, described herein. The computer system 1200 includes a processor 1202, a volatile memory 1204, a non-volatile memory 1206 (e.g., hard disk), an output device 1208 and a user input or interface (UI) 1210, e.g., graphical user interface (GUI), a mouse, a keyboard, a display, and/or any common user interface, etc. The non-volatile memory (non-transitory storage medium) 1206 stores computer instructions 1212 (a.k.a., machine-readable instructions or computer-readable instructions) such as software (computer program product), an operating system 1214 and data 1216. In one example, the computer instructions 1212 are executed by the processor 1202 out of (from) volatile memory 1204. In one embodiment, an article 1218 (e.g., a storage device or medium such as a hard disk, an optical disc, magnetic storage tape, optical storage tape, flash drive, etc.) includes or stores the non-transitory computer-readable instructions. Bus 1220 is also shown.

Processing may be implemented in hardware, software, or a combination of the two. Processing may be implemented in computer programs (e.g., software applications) executed on programmable computers/machines that each includes a processor, a storage medium or other article of manufacture that is readable by the processor (including volatile and non-volatile memory and/or storage elements), and optionally at least one input device, and one or more output devices. Program code may be applied to data entered using an input device or input connection (e.g., a port or bus) to perform processing and to generate output information.

The system 1200 can perform processing, at least in part, via a computer program product or software application, (e.g., in a machine-readable storage device), for execution by, or to control the operation of, data processing apparatus (e.g., a programmable processor, a computer, or multiple computers). Each such program may be implemented in a high-level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer. Processing may also be implemented as a machine-readable storage medium, configured with a computer program, where upon execution, instructions in the computer program cause the computer to operate. Further, the terms "computer" or "computer system" may include reference to plural like terms, unless expressly stated otherwise.

Processing may be performed by one or more programmable processors executing one or more computer programs to perform the functions of the system. All or part of the system may be implemented as, special purpose logic circuitry, e.g., an FPGA (field programmable gate array) and/or an ASIC (application-specific integrated circuit).

Accordingly, embodiments of the inventive subject matter can afford various benefits relative to prior art techniques. For example, embodiments of the present disclosure can enable or allow an audio playback device to adapt the equalization of the transmit audio passively during normal usage, without a need for pausing to source white noise or a swept sine wave. Embodiments of the inventive subject matter also allow the audio device to adapt or be adapted to new rooms and room changes that may affect acoustic performance (e.g., different listener positions, different speaker position, furniture changes, different wall treatments etc.). Since embodiments of the inventive subject matter can adapt incrementally, and thus avoid any need to detect room noise as audio, the user does not have to test the solution to see if it is appropriate. If an embodiment of the present disclosure starts to adapt in an erroneous direction, it will correct the error before there is likely to be any user perception. As noted above, audio devices, such as wireless speakers, are frequently carried to different rooms or moved within a given room. Embodiments of the present inventive subject matter can automatically adapt to these room changes.

Various embodiments of the concepts, systems, devices, structures, and techniques sought to be protected are described above with reference to the related drawings. Alternative embodiments can be devised without departing from the scope of the concepts, systems, devices, structures, and techniques described.

It is noted that various connections and positional relationships (e.g., over, below, adjacent, etc.) may be used to describe elements in the description and drawing. These connections and/or positional relationships, unless specified otherwise, can be direct or indirect, and the described concepts, systems, devices, structures, and techniques are not intended to be limiting in this respect. Accordingly, a coupling of entities can refer to either a direct or an indirect coupling, and a positional relationship between entities can be a direct or indirect positional relationship.

As an example of an indirect positional relationship, positioning element "A" over element "B" can include situations in which one or more intermediate elements (e.g., element "C") is between elements "A" and elements "B" as long as the relevant characteristics and functionalities of elements "A" and "B" are not substantially changed by the intermediate element(s).

Also, the following definitions and abbreviations are to be used for the interpretation of the claims and the specification. The terms "comprise," "comprises," "comprising," "include," "includes," "including," "has," "having," "contains" or "containing," or any other variation are intended to cover a non-exclusive inclusion. For example, an apparatus, a method, a composition, a mixture, or an article, that includes a list of elements is not necessarily limited to only those elements but can include other elements not expressly listed or inherent to such apparatus, method, composition, mixture, or article.

Additionally, the term "exemplary" means "serving as an example, instance, or illustration. Any embodiment or design described as "exemplary" is not necessarily to be construed as preferred or advantageous over other embodiments or designs. The terms "one or more" and "at least one" indicate any integer number greater than or equal to one, i.e., one, two, three, four, etc. The term "plurality" indicates any integer number greater than one. The term "connection" can include an indirect "connection" and a direct "connection".

References in the specification to "embodiments," "one embodiment, "an embodiment," "an example embodiment," "an example," "an instance," "an aspect," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it may affect such feature, structure, or characteristic in other embodiments whether explicitly described or not.

Relative or positional terms including, but not limited to, the terms "upper," "lower," "right," "left," "vertical," "horizontal, "top," "bottom," and derivatives of those terms relate to the described structures and methods as oriented in the drawing figures. The terms "overlying," "atop," "on top, "positioned on" or "positioned atop" mean that a first element, such as a first structure, is present on a second element, such as a second structure, where intervening elements such as an interface structure can be present between the first element and the second element. The term "direct contact" means that a first element, such as a first structure, and a second element, such as a second structure, are connected without any intermediary elements.

Use of ordinal terms such as "first," "second," "third," etc., in the claims to modify a claim element does not by itself connote any priority, precedence, or order of one claim element over another, or a temporal order in which acts of a method are performed, but are used merely as labels to distinguish one claim element having a certain name from another element having a same name (but for use of the ordinal term) to distinguish the claim elements.

The terms "approximately" and "about" may be used to mean within ±20% of a target value in some embodiments, within plus or minus (±) 10% of a target value in some embodiments, within ±5% of a target value in some embodiments, and yet within ±2% of a target value in some embodiments. The terms "approximately" and "about" may include the target value. The term "substantially equal" may be used to refer to values that are within ±20% of one another in some embodiments, within ±10% of one another in some embodiments, within ±5% of one another in some embodiments, and yet within ±2% of one another in some embodiments.

The term "substantially" may be used to refer to values that are within ±20% of a comparative measure in some embodiments, within ±10% in some embodiments, within ±5% in some embodiments, and yet within ±2% in some embodiments. For example, a first direction that is "substantially" perpendicular to a second direction may refer to a first direction that is within ±20% of making a 90° angle with the second direction in some embodiments, within ±10% of making a 90° angle with the second direction in some embodiments, within ±5% of making a 90° angle with the second direction in some embodiments, and yet within ±2% of making a 90° angle with the second direction in some embodiments.

The disclosed subject matter is not limited in its application to the details of construction and to the arrangements of the components set forth in the following description or illustrated in the drawings. The disclosed subject matter is capable of other embodiments and of being practiced and carried out in various ways.

Also, the phraseology and terminology used in this patent are for the purpose of description and should not be regarded as limiting. As such, the conception upon which this disclosure is based may readily be utilized as a basis for the designing of other structures, methods, and systems for carrying out the several purposes of the disclosed subject matter. Therefore, the claims should be regarded as including such equivalent constructions as far as they do not depart from the spirit and scope of the disclosed subject matter.

Although the disclosed subject matter has been described and illustrated in the foregoing exemplary embodiments, the present disclosure has been made only by way of example. Thus, numerous changes in the details of implementation of the disclosed subject matter may be made without departing from the spirit and scope of the disclosed subject matter.

Accordingly, the scope of this patent should not be limited to the described implementations but rather should be limited only by the spirit and scope of the following claims.

All publications and references cited in this patent are expressly incorporated by reference in their entirety.

What is claimed is:

1. A system for providing a given audio system with compensation for acoustic degradation due to noise and physical attributes of a given listening environment, the system comprising:
   a memory comprising computer-executable instructions; and
   a processor coupled to the memory and operative to execute the computer-executable instructions, the computer-executable instructions causing the processor to:
   a. record, for a given audio device in a given listening environment, a selected segment of a transmitted audio stream, wherein the segment includes a transmitted training sequence for deriving a frequency response compensation for the audio device in the listening environment;
   b. form a frequency domain transform of the recorded transmitted segment;
   c. form a frequency domain transform of the recorded selected segment;
   d. derive a frequency difference between the transmitted and recorded versions of the selected segment for determining the frequency domain degradation due to the listening environment and background noise;
   e. form a dynamically maintained noise model of the background noise;
   f. subtract a frequency domain model of the background noise from the frequency domain transform of the recorded signal, thereby forming an adjusted received signal; and
   g. apply a frequency domain compensation curve for the audio device based on slow fractional correction function incorporating the adjusted receive signal.

2. The system of claim 1, wherein the training sequence includes a white noise component.

3. The system of claim 2, wherein the white noise component includes an MLS.

4. The system of claim 1, wherein the processor is further configured to update the model of the background noise based on uncorrelated noise remaining after compensation.

5. The system of claim 1, wherein the processor is configured to apply the compensation curve in real time.

6. The system of claim 1, wherein the processor is further configured to limit adjustment by the compensation curve to a desired attenuation and/or gain.

7. The system of claim 1, wherein the processor is further configured to calculate a noise level based on power levels present in the dynamically maintained noise model to compensate for noise events.

8. A method for an audio system for a particular room, the method comprising:
   a. recording, for a given audio device in a given listening environment, a selected segment of a transmitted audio stream, wherein the segment includes a transmitted training sequence for deriving a frequency response compensation for the audio device in the listening environment;
   b. forming a frequency domain transform of the recorded transmitted segment;
   c. forming a frequency domain transform of the recorded selected segment;
   d. deriving a frequency difference between the transmitted and recorded versions of the selected segment for determining the frequency domain degradation due to the listening environment and background noise;
   e. forming a dynamically maintained noise model of the background noise;
   f. subtracting a frequency domain model of the background noise from the frequency domain transform of the recorded signal, thereby forming an adjusted received signal; and
   g. applying a frequency domain compensation curve for the audio device based on slow fractional correction function incorporating the adjusted receive signal.

9. The method of claim 8, wherein the training sequence incudes a white noise component.

10. The method of claim 9, wherein the white noise component includes an MLS.

11. The method of claim 8, further comprising updating the model of the background noise based on uncorrelated noise remaining after compensation.

12. The method of claim 8, wherein applying the compensation curve is in real time.

13. The method of claim 8, further comprising limiting adjustment by the compensation curve to a desired attenuation and/or gain.

14. The method of claim 8, further comprising calculating a noise level based on power levels present in the dynamically maintained noise model to compensate for noise events.

15. A computer-readable non-transitory storage medium for adapting IIR filters of an audio equalizer (EQ) for a particular room, the medium including computer-readable instructions for:
   a. recording, for a given audio device in a given listening environment, a selected segment of a transmitted audio stream, wherein the segment includes a transmitted training sequence for deriving a frequency response compensation for the audio device in the listening environment;
   b. forming a frequency domain transform of the recorded transmitted segment;
   c. forming a frequency domain transform of the recorded selected segment;
   d. deriving a frequency difference between the transmitted and recorded versions of the selected segment for determining the frequency domain degradation due to the listening environment and background noise;
   e. forming a dynamically maintained noise model of the background noise;
   f. subtracting a frequency domain model of the background noise from the frequency domain transform of the recorded signal, thereby forming an adjusted received signal; and
   g. applying a frequency domain compensation curve for the audio device based on slow fractional correction function incorporating the adjusted receive signal.

16. The storage medium of claim 15, wherein the training sequence includes a white noise component.

17. The storage medium of claim 16, wherein the white noise component includes an MLS.

18. The storage medium of claim 15, wherein the instructions further comprise updating the model of the background noise based on uncorrelated noise remaining after compensation.

19. The storage medium of claim 15, wherein applying the compensation curve is in real time.

20. The storage medium of claim 15, wherein the instructions further comprise limiting adjustment by the compensation curve to a desired attenuation and/or gain.

21. The storage medium of claim 15, wherein the instructions further comprise calculating a noise level based on power levels present in the dynamically maintained noise model to compensate for noise events.

* * * * *